United States Patent
Spring et al.

(10) Patent No.: US 11,255,934 B2
(45) Date of Patent: Feb. 22, 2022

(54) MR RF COIL WITH NON-CONDUCTIVE WAVEGUIDES

(71) Applicant: CANON MEDICAL SYSTEMS CORPORATION, Otawara (JP)

(72) Inventors: Mark Spring, Vernon Hills, IL (US); Yoshinori Hamamura, Vernon Hills, IL (US); Ernie Zepeda, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/857,578

(22) Filed: Apr. 24, 2020

(65) Prior Publication Data
US 2021/0333340 A1    Oct. 28, 2021

(51) Int. Cl.
*G01R 33/34* (2006.01)
*G01R 33/56* (2006.01)
*G01R 33/36* (2006.01)
*G01R 33/345* (2006.01)

(52) U.S. Cl.
CPC ..... *G01R 33/34092* (2013.01); *G01R 33/345* (2013.01); *G01R 33/3607* (2013.01); *G01R 33/5608* (2013.01)

(58) Field of Classification Search
CPC ............ G01R 33/34092; G01R 33/345; G01R 33/3607; G01R 33/5608
See application file for complete search history.

(56) References Cited

U.S. PATENT DOCUMENTS

| 2013/0106537 | A1* | 5/2013 | Biber | G01R 33/3621 333/239 |
| 2013/0266154 | A1* | 10/2013 | McCormack | H04R 3/00 381/117 |
| 2016/0011286 | A1 | 1/2016 | Biber | |
| 2016/0161581 | A1 | 6/2016 | Oh et al. | |
| 2017/0103552 | A1* | 4/2017 | Kim | A61B 5/055 |

FOREIGN PATENT DOCUMENTS

DE    10 2015 223 068 A1    2/2017
GB    2520159 A    5/2015

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance RF receive coil with non-conductive waveguides for data transfer between the RF coil antennas and the channel aggregator is described. The non-conductive waveguide for each channel includes a plastic waveguide transferring data between a millimeter wave transmitter and a millimeter wave receiver.

13 Claims, 6 Drawing Sheets

MR RF COIL WITH NON-CONDUCTIVE WAVEGUIDES

TECHNICAL FIELD

The disclosure relates to a magnetic resonance imaging radio frequency receiver used in medical imaging.

BACKGROUND

Magnetic resonance imaging (MRI) is a technique for imaging of soft tissue structures. In MRI, radio frequency waves are directed at nuclei, for example, protons in a strong external magnetic field. The protons are first excited and then relaxed, emitting radio signals that can be detected and computer processed to form an image. Thereby, Magnetic Resonance (MR) radio frequency (RF) receive coils are necessary parts to receive the RF signals transmitted in a particular MR experiment.

A digital interface for a receiver coil unit may be used. In this case, analog to digital conversion (ADC) may be performed within the receiver coil unit including the receive coil and the receiver. Connector and cable size and handling issues even for high element counts in coils can be overcome by effectively combining multiple elements information to just a few optical fibers or galvanic wires. Comparing a digital interface for a coil to available technologies and components, the digital data transport and combined solution scores high on cost, size and power efficiency. An added benefit of a digital solution is that it allows additional control and acquisition features to be added in the coil with negligible cost, enabling for example tune transmit coils for self-testing coils and control intensive solutions for more efficient coil power supplies etc.

FIG. 1 shows a typical digital RF coil 101 having an ADC 102, for each channel, and a channel aggregator 103 placed close to each other in a shielded box. The RF coil 101 comprises eight channels 104-105. Each ADC 102 having an analog front end 106 is connected to a respective RF coil antenna 107 associated with a respective channel.

There have been proposals bringing ADCs closer to the analog front end but they are not practical. Because doing so would either increase the cost or cause image artifacts due to electromagnetic interference (EMI), radiated and conducted, from the digital data transmission and its associated spectrum.

In current architectures for digital MR coils, two different transmission line types are used to transfer digital acquired data: electrical (e.g., coaxial, triaxial) transmission lines or fiber optic transmission lines.

However both of the above types of the transmission lines present problems.

The problem with electrical cables is twofold: ADCs need to be close to the channel aggregator since the data transfer between them creates EMI issues, which cause image artifacts. EMI noise suppression requires extreme filtering, shielding, and electrical isolation of PC board layouts. These are prone to high common mode currents from the MR transmit fields. Cable traps are then used to combat the high common mode currents. However, their weight and thickness decrease operator usability, and their cost is significant.

With regard to fiber optic transmission lines, one negative issue is their associated high cost. The laser transmitters and receivers are higher cost semiconductors (e.g., GaAs) when compared to, for example, standard CMOS devices. In addition, fiber optic connectors consume high power which heats the RF coils and brings the surface temperature to the limit of safe operation.

SUMMARY

The disclosure herein includes an apparatus and a method to transfer digital acquisition data within an MR RF coil using non-conductive waveguides. Standard CMOS millimeter wave (mmWave) connection-less receivers and transmitters are used in the links between the ADCs and the channel aggregator, for each channel, in the MR RF coil. Furthermore, non-conductive (e.g., PTFE) waveguides are used to transfer data between the mmWave transmitters and receivers.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment.

Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Figure 1:
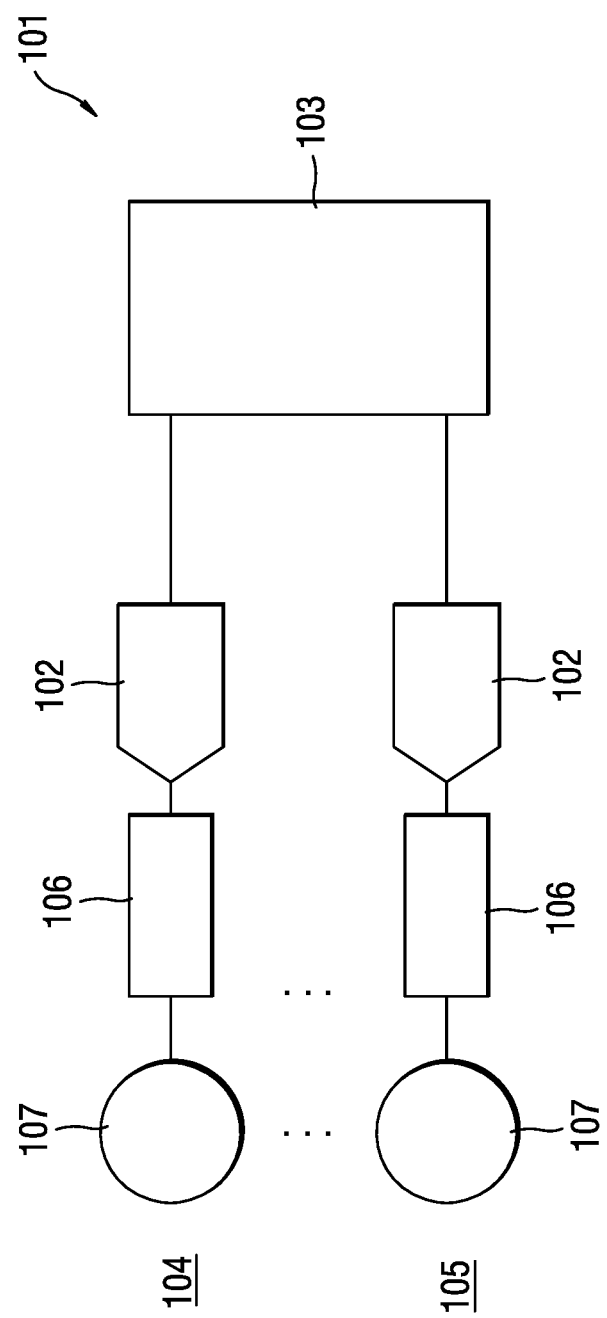
FIG. 1 shows a schematic of a typical digital MR RF coil.
Figure 2:
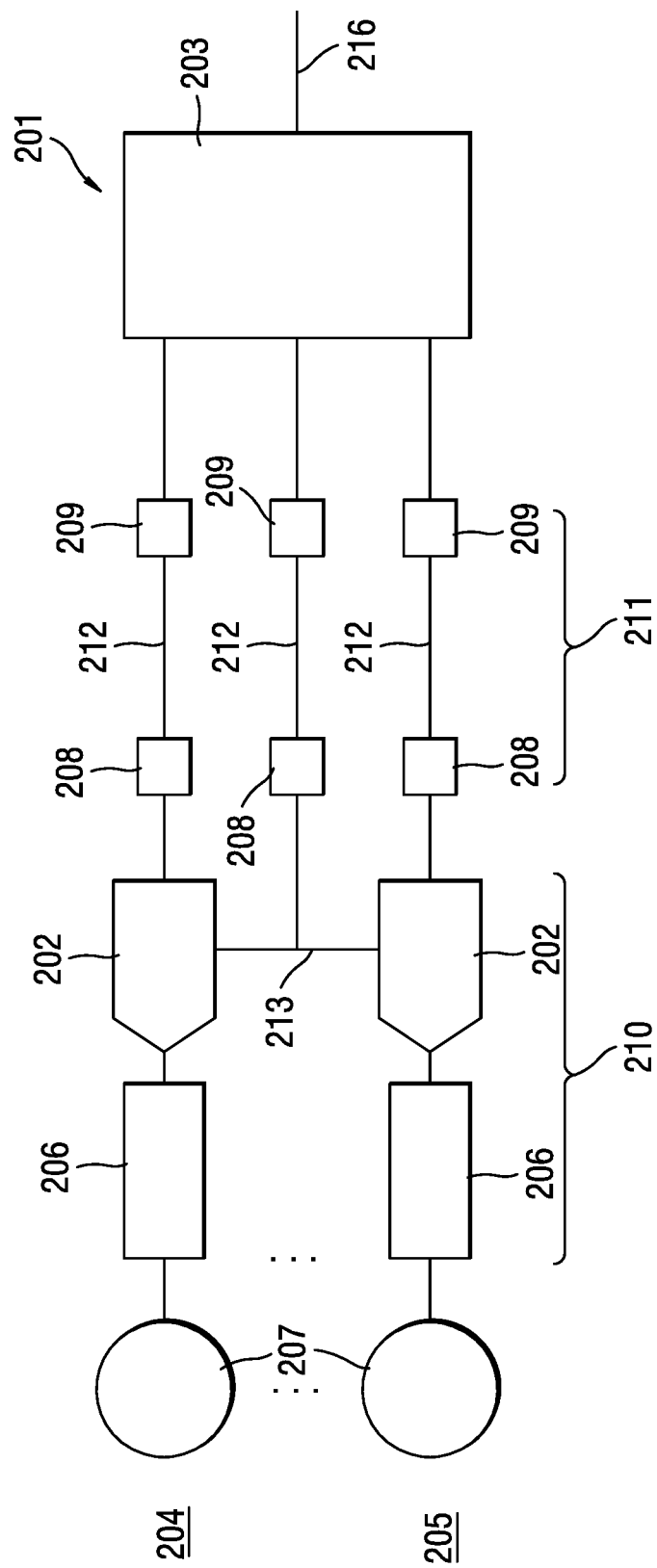
FIG. 2 shows a schematic of an eight channel digital MR RF coil of the present application.

FIG. 2 shows an example embodiment of an eight channel digital MR RF coil 201 with non-conductive millimeter wave waveguides for data transfer. The MR RF coil 201 of the present application comprises eight channels 204-205 receiving the RF signals transmitted in a particular MR experiment. In each channel, an amplification and data digitization unit 210 that includes a front end 206 and an ADC 202 receives the signal from the respective RF coil antenna 207 and transmits it to the channel aggregator 203 via a respective non-conductive waveguide 211. The channel aggregator 203 transmits the signal to/from the MR system via an optical fiber or a non-conductive millimeter-wave waveguide 216.

Each amplification and data digitization unit 210 comprises an ADC 202 and an analog front end 206.

Each non-conductive waveguide 211 comprises a millimeter-wave transmitter 208 at the one end receiving the signal from the amplification and data digitization unit 210 and a millimeter-wave receiver 209 at the other end connected to the channel aggregator 203. The millimeter-wave transmitter 208 and the millimeter-wave receiver 209 are connected via a plastic waveguide 212. The ADCs 202 of the various channels are connected via a control path 213, which in turn is connected to the channel aggregator 203 via a non-conductive waveguide 211.

An 8B/10B encoding scheme may be used for encoding the data streams that ensures an overall DC balance of the serial data stream and also provides sufficient bit transitions such that a downstream receiver can maintain clock recovery.

Figure 3:
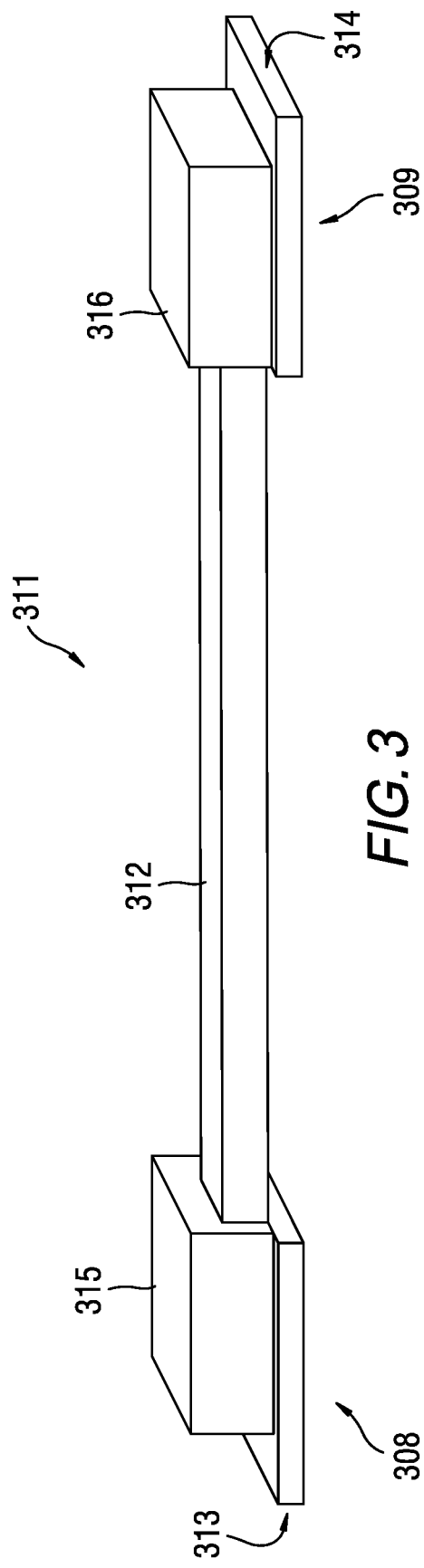
FIG. 3 shows a schematic of a detail of the non-conductive waveguide of the eight channel digital MR RF coil of FIG. 2.

A detail of the non-conductive waveguide 311 used in the digital MR RF coil described herein is shown in FIG. 3.

In particular, at each end of a plastic waveguide 312, there are arranged a mmWave transmitter 308 and a mmWave receiver 309. In one embodiment, the plastic waveguide 312 comprises polytetrafluoroethylene (PTFE) or other low cost non-conductive plastic or polymer.

The mmWave transmitter 308 comprises a transmitter integrated circuit (IC) with integrated mmWave antenna 313 which is coupled to the plastic waveguide 312 via a plastic waveguide coupler 315. At the other end of the data transfer link, the mmWave receiver 309 comprises a receiver IC with integrated mmWave antenna 314 which is coupled to the plastic waveguide 312 via a plastic waveguide coupler 316. In one embodiment, the mmWave transmitter and mmWave receiver comprise standard CMOS devices or other low cost semiconductor devices.

Figure 4:
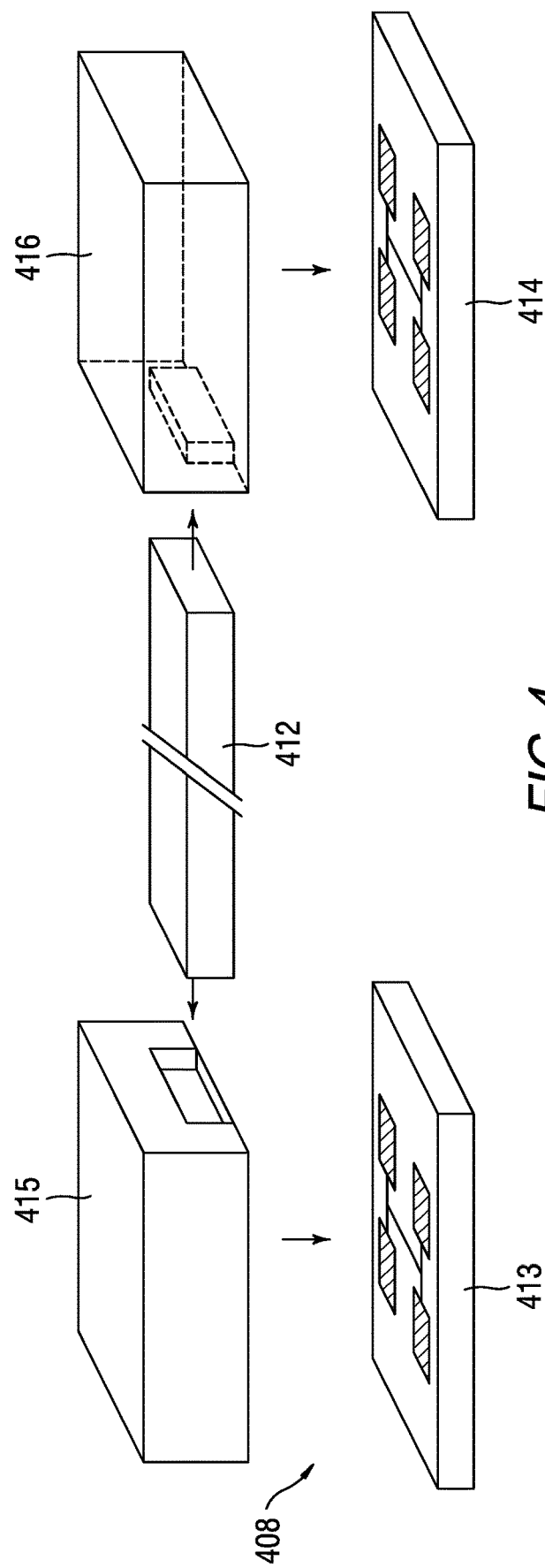
FIG. 4 shows a detailed description of the mmWave transmitter and the mmWave receiver and their connections to the plastic waveguide.

FIG. 4 shows a detailed description of the mmWave transmitter 408 and the mmWave receiver 409 and their connections to the plastic waveguide 412. In one embodiment, the mmWave transmitter 408 comprises a plastic waveguide coupler 415 attached to the top of integrated transmitter antenna 413. When a wave is launched from the transmitter antenna 413, a mode of propagation is set up, for example, Er≈2.0, and the fields outside the coupler (Er≈1.0) decay exponentially. The plastic waveguide 412 is inserted into respective openings of the plastic waveguide couplers 415 and 416. Similarly, the plastic waveguide coupler 416 is attached to the top of integrated transmitter antenna 414.

Figure 5:
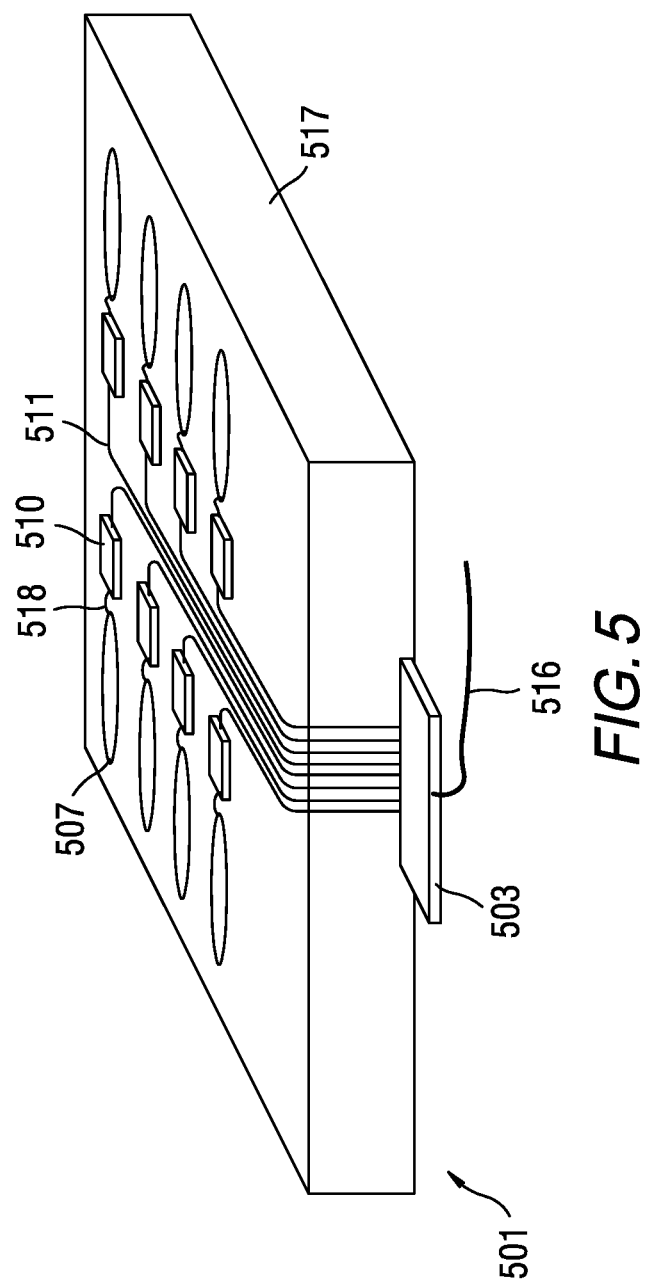
FIG. 5 shows an example layout of an eight channel digital MR RF coil of FIG. 2.

FIG. 5 shows an example layout of the eight channel digital MR RF coil 501 of the present application. In one embodiment, the array of the loop antennas, the amplification and acquisition data digitization units, the non-conductive millimeter-wave waveguides and the channel aggregator is arranged on a substrate 517.

In particular, the eight loop antennas 507 are arranged symmetrically on each side of eight respective non-conductive millimeter-wave waveguides 511. An amplification and acquisition data digitization unit 510, connected to a respective loop antenna 507 via an electrical connection 518, transmits received data, via a respective non-conductive millimeter-wave waveguide 511, to the channel aggregator 503 arranged on the side of the substrate 517, for each channel. Digital data received by the channel aggregator 503 is transmitted to and from the MR system via an optical fiber or a non-conductive millimeter-wave waveguide 516.

Figure 6:
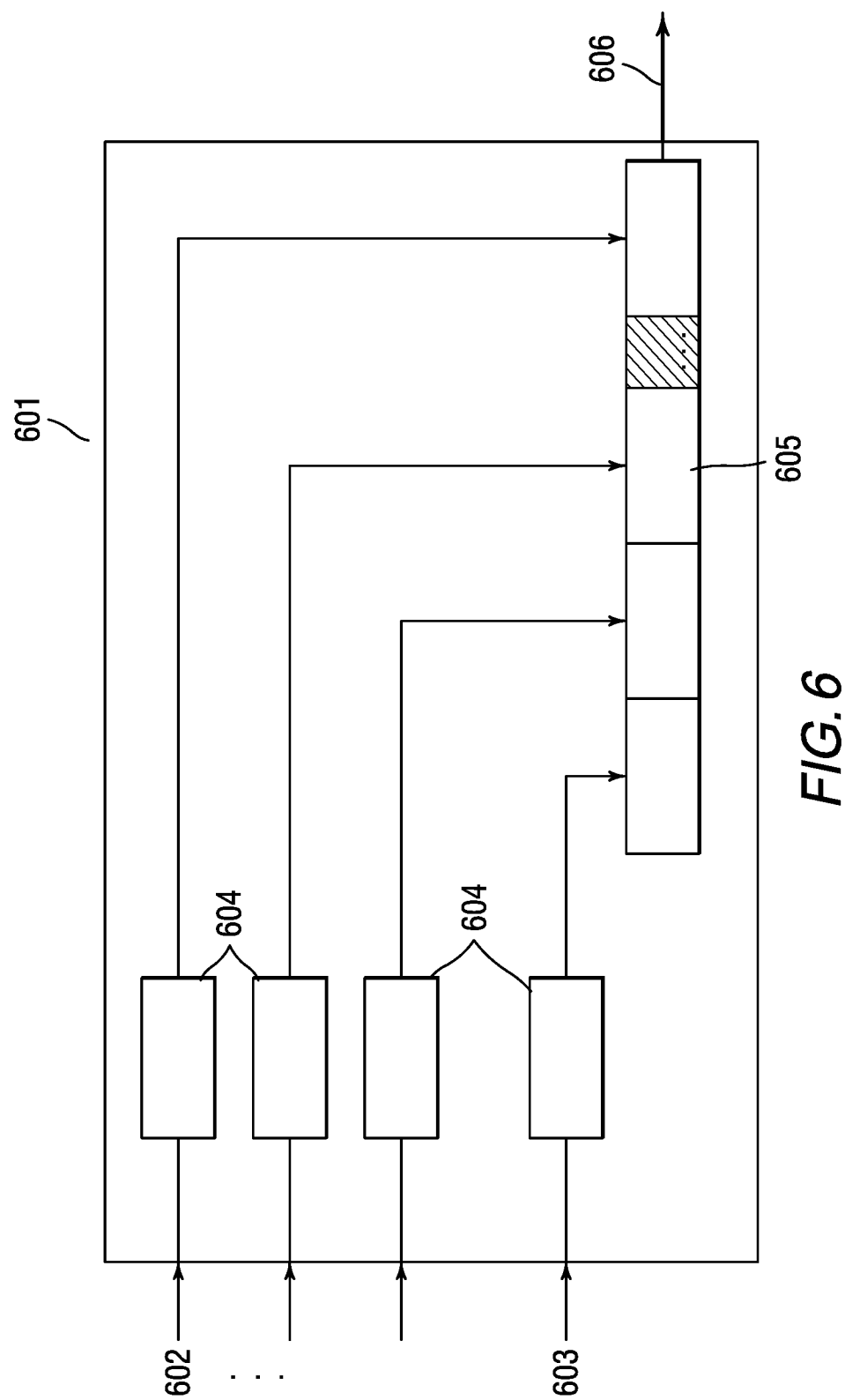
FIG. 6 shows an arrangement for a channel aggregator.

FIG. 6 shows an arrangement for a channel aggregator 601 receiving input signals 602-603 from the different channels, each input signal being a serial data stream at a bit rate X. A buffer 604 in the channel aggregator 601 receives the input stream and directs the data to a dual port RAM 605. The channel aggregator 601 outputs the data as a serial stream at a bit rate of X*(n+1).

The MR RF coil of the present application enables ADCs and associated digital data transfer circuits to be placed close to the analog feedpoints without creating EMI. Furthermore, it eliminates multiple cable traps, filtering, and shielding for each channel. This lowers the coil's mass, improving work flow efficiency.

In addition, the MR RF coil of the present application enables electrical isolation between digitizing and aggregation circuits within the digital MRI coil and enables lower cost data transfer when compared to MR RF coils having electrical or optical waveguide data transmission lines.

Numerous modifications and variations of the embodiments presented herein are possible in light of the above teachings. It is therefore to be understood that within the scope of the claims, the disclosure may be practiced otherwise than as specifically described herein.

The invention claimed is:

1. A magnetic resonance (MR) imaging radio frequency (RF) digital receiver coil, the digital MR RF coil comprising:
   a channel aggregator that receives signals at each of a plurality of channels within the MR RF receiver;
   amplification and data digitization circuitry that receives data from a respective RF coil antenna, for each channel; and
   a non-conductive millimeter-wave waveguide that transmits data outputted by the amplification and data digitization circuitry to the channel aggregator, for each channel, wherein the non-conductive millimeter-wave waveguide comprises:
   a millimeter-wave transmitter, a millimeter-wave receiver; and
   a waveguide connecting the millimeter-wave transmitter and the millimeter-wave receiver.

2. The digital MR RF coil of claim 1, wherein
   the millimeter-wave transmitter comprises a transmitter integrated circuit (IC) with an integrated millimeter-wave antenna and the millimeter-wave receiver comprises a receiver IC with an integrated millimeter-wave antenna; and
   a waveguide coupler connects the millimeter antennas to the waveguide connecting the millimeter-wave transmitter and the millimeter-wave receiver.

3. The digital MR RF coil of claim 2, wherein
   the transmitter IC comprises CMOS and the receiver IC comprises CMOS.

4. The digital MR RF coil of claim 2, wherein
   the waveguide connecting the millimeter-wave transmitter and the millimeter-wave receiver comprises plastic and the waveguide coupler connecting the millimeter antennas to the waveguide connecting the millimeter-wave transmitter and the millimeter-wave receiver comprises plastic.

5. The digital MR RF coil of claim 4, wherein
   the plastic comprises polytetrafluoroethylene (PTFE).

6. A method of transferring digital acquisition data within a magnetic resonance (MR) imaging radio frequency (RF) digital receiver coil in an MR system, the method comprising:
   receiving analog RF signals at each of a plurality of channels within the MR RF receiver at respective RF coil antennas;
   converting the analog RF signal into a digital signal using amplification and data digitization circuitry, at each channel;
   transmitting data outputted by the amplification and data digitization circuitry to a channel aggregator, at each channel, using a non-conductive millimeter-wave waveguide connecting the amplification and data digitization circuitry to the channel aggregator; and transmitting the data outputted from the channel aggregator to the MR system, wherein the non-conductive millimeter-wave waveguide comprises:
- a millimeter-wave transmitter, a millimeter-wave receiver; and
- a waveguide connecting the millimeter-wave transmitter and the millimeter-wave receiver.

7. The method of claim 6, wherein
the millimeter-wave transmitter comprises a transmitter integrated circuit (IC) with an integrated millimeter-wave antenna and the millimeter-wave receiver comprises a receiver IC with an integrated millimeter-wave antenna; and
a waveguide coupler connects the millimeter antennas to the waveguide connecting the millimeter-wave transmitter and the millimeter-wave receiver.

8. The method of claim 7, comprising
transmitting the data outputted from the channel aggregator to the MR system via an optical fiber.

9. The method of claim 7, wherein comprising
transmitting the data outputted from the channel aggregator to the MR system via a non-conductive millimeter-wave waveguide.

10. The method of claim 7, comprising:
generating a serial output stream by combining the data transmitted to the channel aggregator; and
outputting the serial output stream as the data outputted from the channel aggregator.

11. The method of claim 7, comprising transmitting the data outputted by the amplification and data digitization circuitry to the channel aggregator using a plurality of non-conductive millimeter-wave waveguides respectively provided for the channels.

12. The digital MR RF coil of claim 1, wherein the channel aggregator comprises:
a buffer respectively provided for each of the plurality of channels and configured to receive one of the signals; and
a memory configured to receive signals outputted by each of the buffers and to generate a serial output stream from the outputted signals.

13. The digital MR RF coil of claim 1, comprising a plurality of non-conductive millimeter-wave waveguides respectively provided for the channels and each being connected to the channel aggregator.

* * * * *